(12) United States Patent
Murali et al.

(10) Patent No.: US 10,615,813 B1
(45) Date of Patent: Apr. 7, 2020

(54) ANALOG-TO-DIGITAL CONVERTER NON-LINEARITY CORRECTION USING MULTI-NYQUIST DIFFERENTIATOR

(71) Applicant: TEXAS INSTRUMENTS INCORPORATED, Dallas, TX (US)

(72) Inventors: Sriram Murali, Bengaluru (IN); Jaiganesh Balakrishnan, Bengaluru (IN); Chandrasekhar Sriram, Chennai (IN); Sashidharan Venkatraman, Bengaluru (IN); Jagdish Kumar Agrawal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/398,393

(22) Filed: Apr. 30, 2019

Related U.S. Application Data

(60) Provisional application No. 62/787,014, filed on Dec. 31, 2018.

(51) Int. Cl.
  *H03M 1/06* (2006.01)
  *H03H 17/02* (2006.01)
  *H03M 1/00* (2006.01)

(52) U.S. Cl.
  CPC ...... *H03M 1/0626* (2013.01); *H03H 17/0227* (2013.01); *H03M 1/004* (2013.01)

(58) Field of Classification Search
  None
  See application file for complete search history.

(56) References Cited

U.S. PATENT DOCUMENTS

| | | | | |
|---|---|---|---|---|
| 7,199,736 B2 * | 4/2007 | Batruni | ............. | H03H 17/0211 330/136 |
| 9,935,645 B1 * | 4/2018 | Tangudu | ............. | H03M 1/1042 |
| 2005/0219088 A1 * | 10/2005 | Batruni | ............. | H03M 1/0612 341/118 |
| 2006/0092058 A1 * | 5/2006 | Slavin | ................ | H03M 1/1033 341/120 |
| 2017/0324421 A1 * | 11/2017 | Tangudu | ............. | H03M 1/0617 |

\* cited by examiner

*Primary Examiner* — Howard Williams
(74) *Attorney, Agent, or Firm* — John R. Pessetto; Charles A. Brill; Frank D. Cimino

(57) ABSTRACT

Multi-Nyquist differentiator circuits and a radio frequency sampling receiver that applies a multi-Nyquist differentiator circuit. A multi-Nyquist differentiator includes a fixed coefficient filter, a scaling circuit, and a summation circuit. The fixed coefficient filter is configured to filter digital samples generated by an ADC. The scaling circuit is coupled to an output of the fixed coefficient filter, and is configured to scale output of the fixed coefficient filter based on a selected Nyquist band. The summation circuit is coupled to the scaling circuit, and is configured to generate a derivative of the digital samples based on output of the scaling circuit.

22 Claims, 5 Drawing Sheets

ANALOG-TO-DIGITAL CONVERTER NON-LINEARITY CORRECTION USING MULTI-NYQUIST DIFFERENTIATOR

CROSS-REFERENCE TO RELATED APPLICATIONS

The present application claims priority to U.S. Provisional Patent Application No. 62/787,014, filed Dec. 31, 2018, entitled "Analog-to-Digital Converter Non-Linearity Correction using Multi-Nyquist Differentiator," which is hereby incorporated herein by reference in its entirety.

BACKGROUND

In wireless transceivers, down converters transform a radio frequency (RF) signal into a baseband signal centered at the zero frequency. Similarly, up converters transform a baseband signal into an RF signal. Down conversion and up conversion have traditionally been performed in the analog domain. However, the wireless transceivers of the next generation perform down conversion and/or up conversion in the digital domain. For example, a receiver may employ RF sampling, in which the RF signal is directly sampled with a high speed, high performance analog-to-digital converter (ADC) (e.g., a 14 bit, 3 giga-sample-per-second ADC). The use of RF sampling allows such receivers to employ digital down-converters that avoid mixers in the RF/analog domain. In a digital down-converter, mixing is implemented using digital multiplication circuitry.

SUMMARY

Implementations of a multi-Nyquist differentiator circuit and a radio frequency (RF) sampling receiver that applies the multi-Nyquist differentiator circuit are disclosed herein. In one example, a radio frequency (RF) sampling receiver includes an analog-to-digital converter (ADC) and a non-linearity correction circuit. The ADC is configured to digitize received RF signals. The non-linearity correction circuit is coupled to an output of the ADC. The non-linearity correction circuit includes a multi-Nyquist differentiator. The multi-Nyquist differentiator includes a fixed coefficient filter, a scaling circuit, and a summation circuit. The fixed coefficient filter is configured to filter digital samples generated by the ADC. The scaling circuit is coupled to an output of the fixed coefficient filter, and is configured to scale output of the fixed coefficient filter based on a selected Nyquist band. The summation circuit is coupled to the scaling circuit, and is configured to generate a derivative of the digital samples based on output of the scaling circuit.

In another example, a multi-Nyquist differentiator circuit includes a first fixed coefficient filter, a second fixed coefficient filter, and output circuitry. The first fixed coefficient filter is configured to filter digital samples generated by an ADC. The second fixed coefficient filter is configured to filter the digital samples generated by the ADC. The output circuitry is coupled to the first fixed coefficient filter and the second fixed coefficient filter, and is configured to combine output of the first fixed coefficient filter and output of the second fixed coefficient filter to generate a derivative of the digital samples.

In a further example, a multi-Nyquist differentiator circuit includes a fixed coefficient filter and output circuitry. The fixed coefficient filter is configured to filter digital samples generated by the ADC. The fixed coefficient filter includes an odd sub-filter and an even sub-filter. The odd sub-filter is configured to produce an output based on odd-indexed taps of the fixed coefficient filter. The even sub-filter configured to produce an output based on even-indexed taps of the fixed coefficient filter. The output circuitry is coupled to the fixed coefficient filter, and is configured to combine output of the odd sub-filter and the even sub-filter to generate a derivative of the digital samples.

BRIEF DESCRIPTION OF THE DRAWINGS

For a detailed description of various examples, reference will now be made to the accompanying drawings in which.

DETAILED DESCRIPTION

Figure 1:
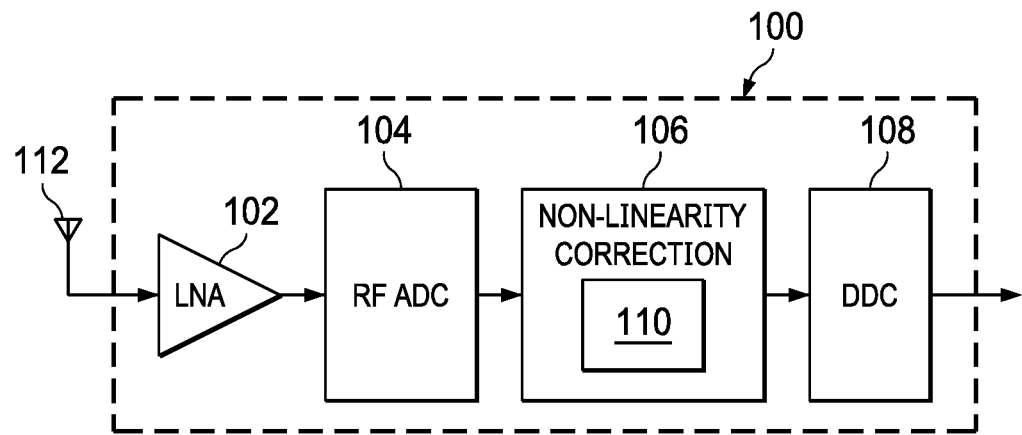
FIG. 1 shows a block diagram for an example radio frequency sampling receiver in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Radio frequency (RF) sampling receivers employ RF analog-to-digital converters (ADCs) to digitize received RF signals prior to downconversion. The conversion rate of an RF ADC is high (e.g., in the range of 3 giga-samples per second (GSPS)). The ADC may be used to digitize RF signals at frequencies beyond the first Nyquist band by presenting to the ADC only signal frequencies of a selected Nyquist band. For example, an ADC sampling at 3 GSPS may be used digitize signals at frequencies above the first Nyquist band (e.g., 0-1.5 GHz) by presenting to the ADC only signals having frequencies within the selected Nyquist band (e.g., 1.5-3 GHz for the second Nyquist band).

ADCs used in wireless infrastructure must meet strict harmonic distortion and intermodulation distortion requirements to conform to cellular system standards. Harmonic distortion and intermodulation distortion of an ADC can be improved by applying a digital non-linearity correction to the output of the ADC. ADC non-linearity may be modeled as including terms based on the derivative of the input signal:

$$y(t)=G(x(t)+\alpha x^2(t)+\beta x(t)x'(t)+\gamma x^3(t)+\delta x^2(t)x'(t)+ \dots ) \quad (1)$$

where:

x(t) is the input signal; and x'(t) is the derivative of the input signal.

Accordingly, to estimate and correct non-linearity of an RF ADC used to digitize signals in multiple Nyquist bands, multi-Nyquist band digital differentiators are needed. Some systems include a separate filter for generating the derivatives in each Nyquist band. For example, a system that supports six Nyquist bands would include six fixed-coefficient filters, one filter for each Nyquist band. The filters consume substantial circuit area in such systems. Other systems use a programmable filter that selects different filter coefficients for each Nyquist band. The programmable filter requires multipliers which also require significant surface area.

The multi-Nyquist differentiators disclosed herein require less circuit area than other implementations. The multi-Nyquist differentiators of the present disclosure require no programmable filters, and no more than two fixed coefficient filters. The output(s) of the fixed coefficient filter(s) are scaled and summed to produce the derivative of the filter input signal for a selected Nyquist band. The scaling factors applied to the filter outputs are selected based on the Nyquist band in which the ADC is operating. Some implementations may also sum the outputs of the fixed coefficient filter(s) to produce a first Nyquist band derivative in parallel with the derivative for the selected Nyquist band.

FIG. 1 shows a block diagram for an RF sampling receiver 100 in accordance with the present disclosure. The RF sampling receiver 100 may be applied in a RF base station or other RF wireless device that provides for wireless signal reception. The RF sampling receiver 100 includes a low noise amplifier (LNA) 102, a radio frequency (RF) analog-to-digital converter (ADC) 104, a non-linearity correction circuit 106, and a digital down converter (DDC) 108. The non-linearity correction circuit 106 is coupled to an antenna 112.

The LNA 102 is coupled to antenna 112. The antenna 112 converts RF signals between conducted and airwave form. The LNA 102 amplifies RF signals detected by the antenna 112 prior to digitization of the RF signals by the RF ADC 104. The RF ADC 104 converts analog RF signals into digital samples at a high rate (e.g., 3 giga-samples per second) and with high bit resolution (e.g., 14 bits). The RF ADC 104 may be configured to operate in any one of multiple Nyquist bands. To reduce non-linearity of the digital samples generated by the RF ADC 104, the non-linearity correction circuit 106 applies Nyquist band specific non-linearity correction to the digital samples. The non-linearity correction circuit 106 includes a multi-Nyquist differentiator circuit 110 that generates the derivative of the digital samples for the Nyquist band in which the RF ADC 104 is operating. The non-linearity correction circuit 106 applies the derivative values to correct non-linearity in the digital samples. The DDC 108 downconverts the digitized RF signals to base-band or to one or more selected intermediate frequencies. Embodiments of the DDC 108 may include a multiplier that multiplies the non-linearity corrected samples with a digital local oscillator signal to implement the downconversion.

Figure 2:
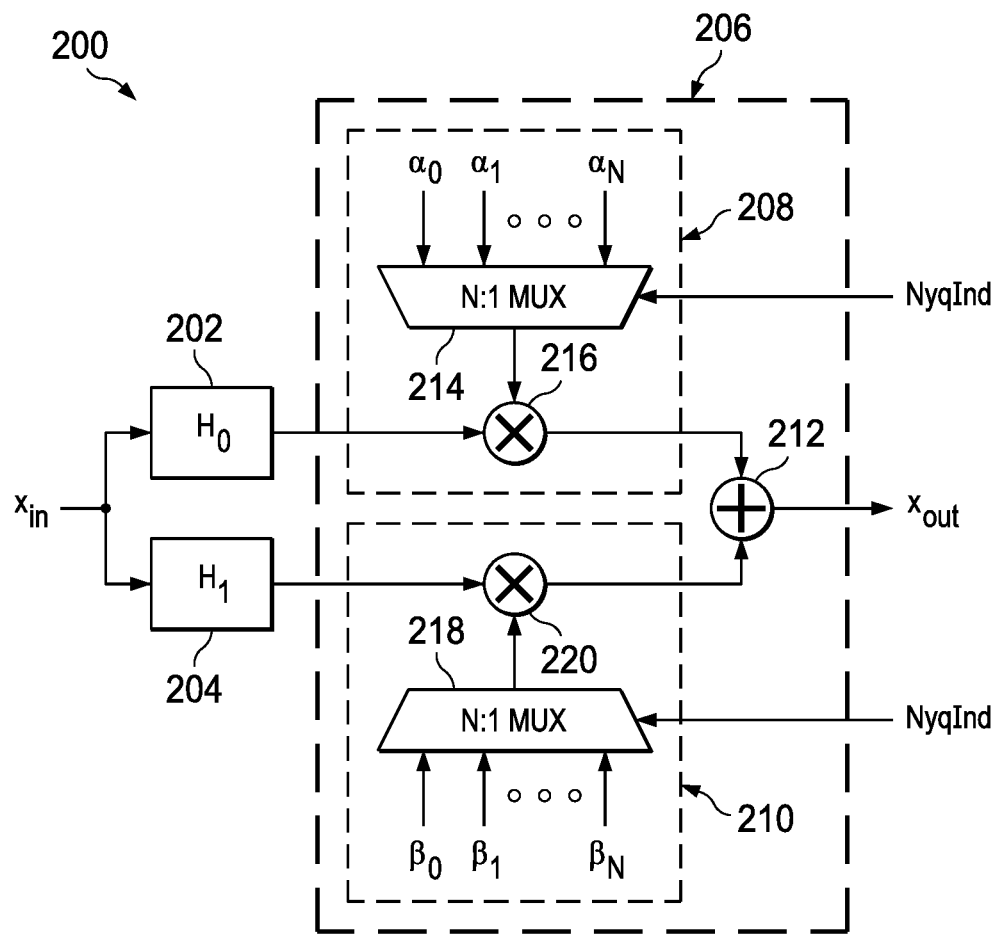
FIG. 2 shows a block diagram for an example multi-Nyquist differentiator that includes two fixed coefficient filters in accordance with the present disclosure.

FIG. 2 shows a block diagram for an example multi-Nyquist differentiator 200 (multi-Nyquist differentiation circuit 200). The multi-Nyquist differentiator 200 is an example of the multi-Nyquist differentiator circuit 110. The multi-Nyquist differentiator 200 includes a fixed coefficient filter 202, a fixed coefficient filter 204, and output circuitry 206. The fixed coefficient filter 202 and the fixed coefficient filter 204 receive and apply a digital filter to the digital samples ($x_{in}$) generated by the RF ADC 104. The output circuitry 206 receives the output of the fixed coefficient filter 202 and fixed coefficient filter 204, scales each output, and combines the scaled outputs to produce a derivative ($x_{out}$) of the digital samples ($x_{in}$) generated by the RF ADC 104.

Figure 3:
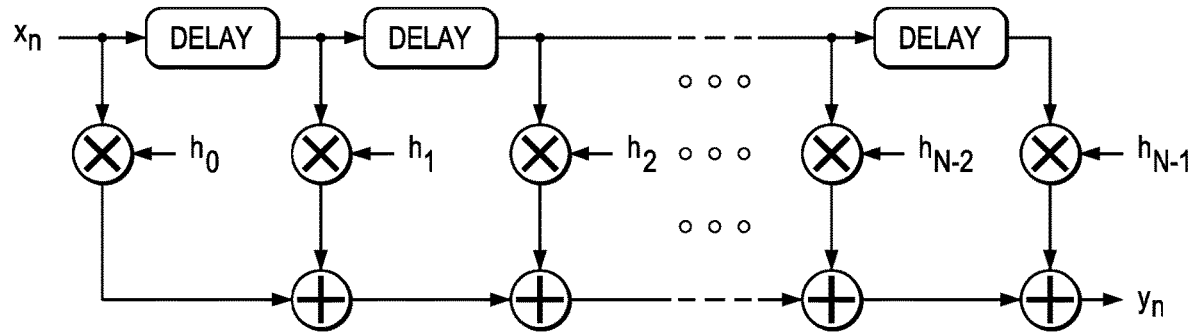
FIG. 3 shows an example finite impulse response filter suitable for implementing the fixed coefficient filters of a multi-Nyquist differentiator in accordance with the present disclosure.

In the fixed coefficient filter 202 and the fixed coefficient filter 204, the coefficients applied to the digital samples generated by the RF ADC 104 are predetermined and unchanging. As a result, the computation circuitry of the fixed coefficient filter 202 and the fixed coefficient filter 204 can be simplified to provide multiplication by the constant coefficients. For example, multiplications in the fixed coefficient filter 202 and the fixed coefficient filter 204 may be implemented using canonical signed digit multipliers that include shifters and adders. Various implementations of the fixed coefficient filter 202 and the fixed coefficient filter 204 may be implemented as direct form finite impulse response (FIR) filters, transpose form FIR filters, cascade form FIR filters, infinite impulse response (IIR) filters, etc. FIG. 3 shows a direct form FIR filter that may be applied in an implementation of the fixed coefficient filter 202 or the fixed coefficient filter 204.

The output circuitry 206 includes a scaling circuit 208, a scaling circuit 210, and a summation circuit 212. The scaling circuit 208 scales the output of the fixed coefficient filter 202 by a value that is selected based on the Nyquist band in which the RF ADC 104 is operating. The scaling circuit 208, as represented in FIG. 2, includes a multiplexer 214 and a multiplier 216. The multiplexer 214 selects a scaling factor ($\alpha_x$) based on the Nyquist index value, which specifies the Nyquist band in which the ADC 104 is operating, and the multiplier 216 multiples the output of the fixed coefficient filter 202 by the selected scaling factor. In some implementations, multiplication by the scaling factors may be implemented as constant multiplications, where the Nyquist index selects the constant multiplication circuitry to be applied to the output of the fixed coefficient filter 202.

The scaling circuit 210 is similar to the scaling circuit 208, and may apply scaling factors that are different from those applied by the scaling circuit 208. The scaling circuit 210 scales the output of the fixed coefficient filter 204 by a value that is selected based on the Nyquist band in which the RF ADC 104 is operating. The scaling circuit 210, as represented in FIG. 2, includes a multiplexer 218 and a multiplier 220. The multiplexer 218 selects a scaling factor ($\beta_x$) based on the Nyquist index value, and the multiplier 220 multiples the output of the fixed coefficient filter 204 by the selected scaling factor. In some implementations, multiplication by the scaling factors may be implemented as constant multiplications, where the Nyquist index selects the constant multiplication circuitry to be applied to the output of the fixed coefficient filter 204.

Table 1 below shows an example of scaling factors applied by the scaling circuit 208 and the scaling circuit 210. Some implementations of the multi-Nyquist differentiator 200 may employ different scaling factors and/or a different number of scaling factors for use with a different number of Nyquist bands.

TABLE 1

| Nyquist Band | $\alpha_k$ | $\beta_k$ |
|---|---|---|
| 1 | 0 | 1 |
| 2 | 1 | −1/2 |
| 3 | 2/3 | 1/3 |
| 4 | 1 | −1/4 |
| 5 | 4/5 | 1/5 |
| 6 | 1 | −1/6 |

The summation circuit 212 is coupled to the scaling circuit 208 and the scaling circuit 210, and sums the output of the scaling circuit 208 and the scaling circuit 210 to produce the derivative of the digital samples generated by the RF ADC 104 for the selected Nyquist band.

Figure 4:
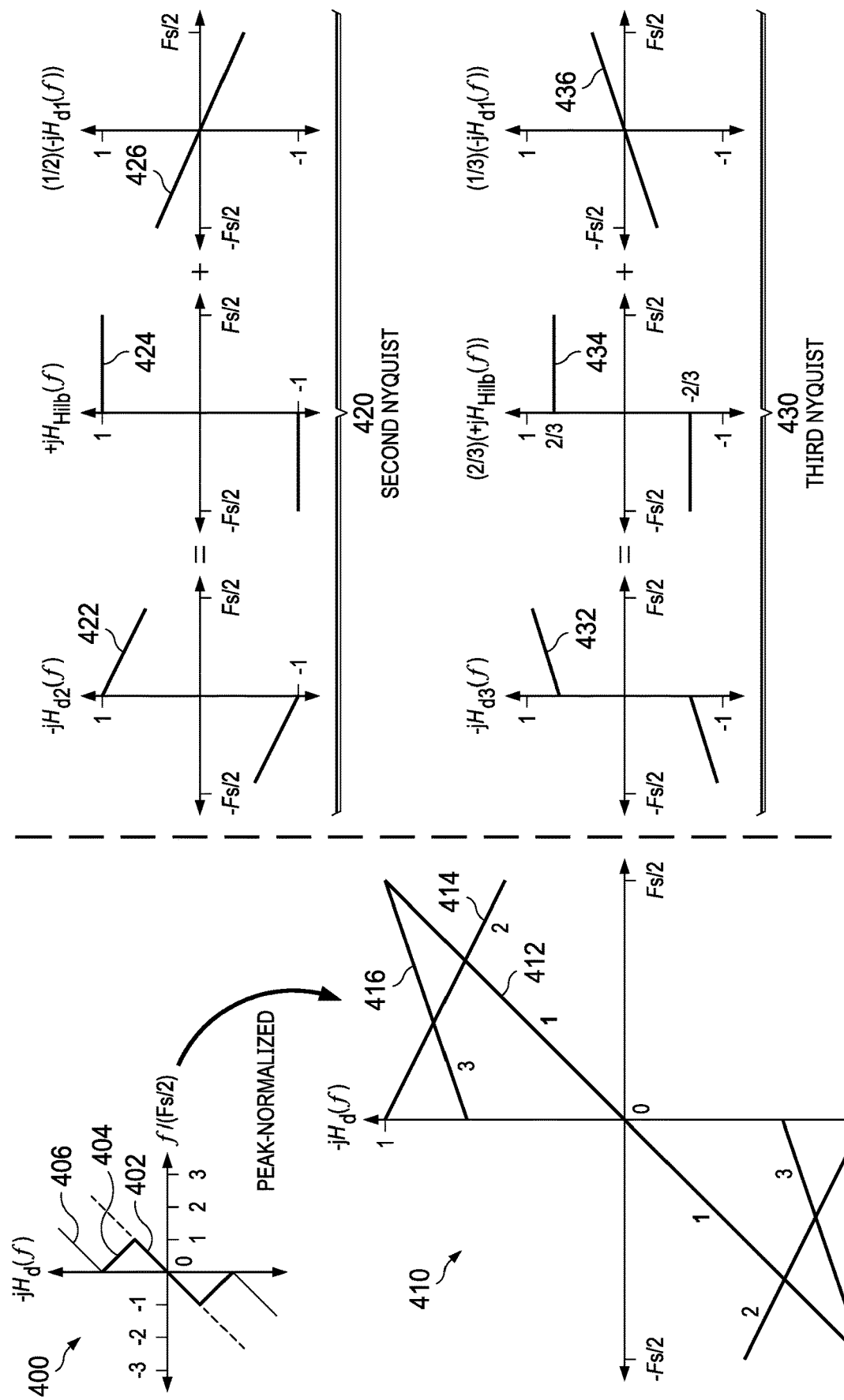
FIG. 4 shows examples of combination of the outputs of two fixed coefficient filters to produces derivatives for multiple Nyquist bands in accordance with the present disclosure.

FIG. 4 shows examples of combination of the outputs of the fixed coefficient filter 202 and the fixed coefficient filter 204 to produce derivatives for multiple Nyquist bands in accordance with the present disclosure. Graph 400 shows the frequency response of the derivative 402 for the first Nyquist band, the derivative 404 for the second Nyquist band, and the derivative 406 for the third Nyquist band. Graph 410 shows frequency response of the derivative 412 for the first Nyquist band, the derivative 414 for the second Nyquist band, and the derivative 416 for the third Nyquist band, which are the peak-normalized form of the derivative 402, the derivative 404, and the derivative 406 respectively.

Graphs 420 shows that the frequency response of the derivative of the second Nyquist can be generated by combining the frequency response of the derivative of the first Nyquist and the frequency response of a Hilbert transform. The graph 426 shows the frequency response of the derivative of the first Nyquist scaled by −½. The 424 shows the frequency response of the Hilbert transform scaled by 1. The graph 422 shows the sum of the scaled frequency response of the derivative of the first Nyquist and the scaled frequency response of the Hilbert transform to form the frequency response of the derivative of the second Nyquist.

Graphs 430 show that the frequency response of the derivative of the third Nyquist can be generated by combining the frequency response of the derivative of the first Nyquist and the frequency response of a Hilbert transform. The graph 436 shows the frequency response of the derivative of the first Nyquist scaled by ⅓. The graph 434 shows the frequency response of the Hilbert transform scaled by ⅔. The graph 432 shows the sum of the scaled frequency response of the derivative of the first Nyquist and the scaled frequency response of the Hilbert transform to form the frequency response of the derivative of the third Nyquist.

Thus, by summing scaled frequency responses of the Hilbert transform and the derivative of the first Nyquist band, the frequency response of the derivative of any Nyquist band can be generated. In some implementations of the multi-Nyquist differentiator 200, the fixed coefficient filter 202 implements the Hilbert transform and the fixed coefficient filter 204 implements the derivative of the first Nyquist band. As shown in FIG. 4, by scaling the outputs of the fixed coefficient filter 202 and the fixed coefficient filter 204 and summing the scaled outputs, the multi-Nyquist differentiator 200 generates the derivative of digital samples generated by the RF ADC 104 for any Nyquist band.

$$H_{d_k}(z) = \alpha_k(-H_{Hilb}(z)) + \beta_k H_{d_1}(z) \quad (2)$$

Figure 5:
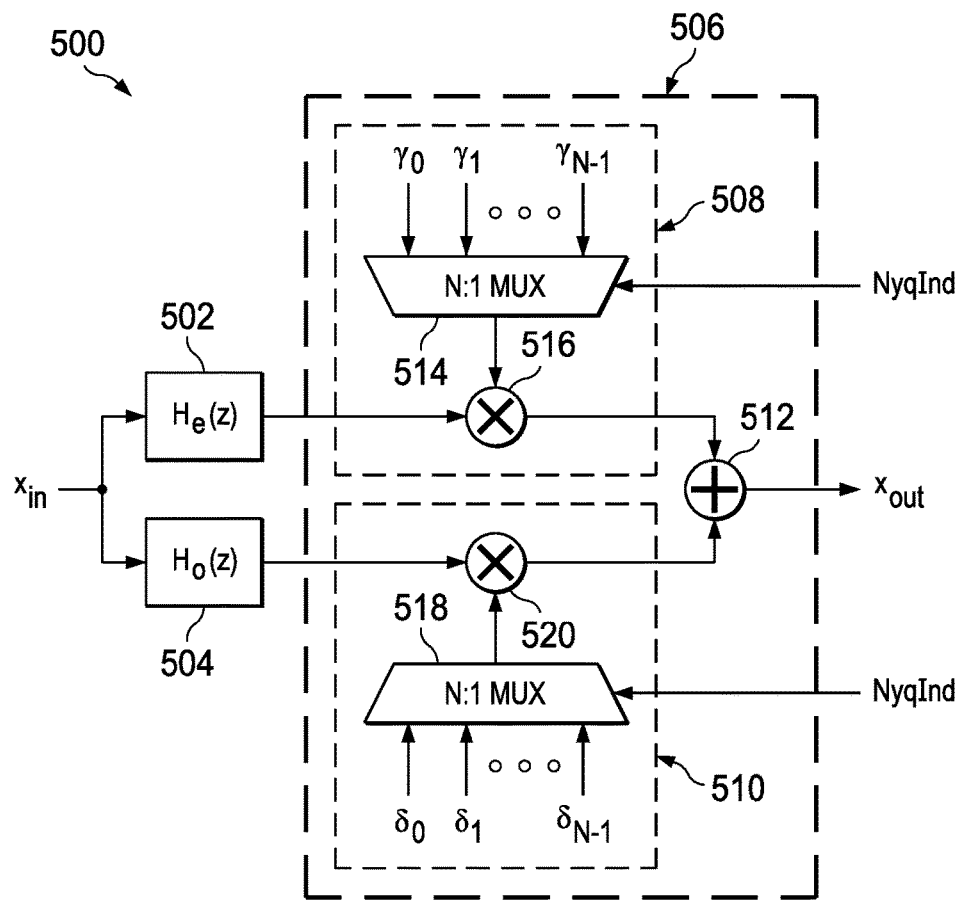
FIG. 5 shows a block diagram for an example multi-Nyquist differentiator that includes odd and even fixed coefficient filters in accordance with the present disclosure.

FIG. 5 shows a block diagram for an example multi-Nyquist differentiator 500 that includes odd and even fixed coefficient filters in accordance with the present disclosure. The multi-Nyquist differentiator 500 is an example of the multi-Nyquist differentiator 200. The multi-Nyquist differentiator 500 includes a fixed coefficient filter 502 and fixed coefficient filter 504 and output circuitry 506. The fixed coefficient filter 502 and the fixed coefficient filter 504 receive and apply a digital filter to the digital samples ($x_{in}$) generated by the RF ADC 104. The output circuitry 506 receives the output of the fixed coefficient filter 502 and fixed coefficient filter 504, scales each output, and combines the scaled outputs to produce a derivative ($x_{out}$) of the digital samples ($x_{in}$) generated by the RF ADC 104.

In the fixed coefficient filter 502 and the fixed coefficient filter 504, the coefficients applied to the digital samples generated by the RF ADC 104 are predetermined and unchanging. As a result, the computation circuitry of the fixed coefficient filter 502 and the fixed coefficient filter 504 can be simplified to provide multiplication by the constant coefficients. For example, multiplications in the fixed coefficient filter 502 and the fixed coefficient filter 504 may be implemented using canonical signed digit multipliers. Various implementations of the fixed coefficient filter 502 and the fixed coefficient filter 504 may be implemented as direct form finite impulse response (FIR) filters, transpose form FIR filters, cascade form FIR filters, infinite impulse response (IIR) filters, etc. In the fixed coefficient filter 502 each odd indexed tap is zero. In the fixed coefficient filter 504, each even indexed tap is zero.

The output circuitry 506 includes a scaling circuit 508, a scaling circuit 510, and a summation circuit 512. The scaling circuit 508 scales the output of the fixed coefficient filter 502 by a value that is selected based on the Nyquist band in which the RF ADC 104 is operating. The scaling circuit 508, as represented in FIG. 5, includes a multiplexer 514 and a multiplier 516. The multiplexer 514 selects a scaling factor ($\gamma_x$) based on the Nyquist index value, and the multiplier 516 multiples the output of the fixed coefficient filter 502 by the selected scaling factor. In some implementations, multiplication by the scaling factors may be implemented as constant multiplications, where the Nyquist index selects the constant multiplication circuitry to be applied to the output of the fixed coefficient filter 502.

The scaling circuit 510 is similar to the scaling circuit 508, and may apply scaling factors that are different from those applied by the scaling circuit 508. The scaling circuit 510 scales the output of the fixed coefficient filter 504 by a value that is selected based on the Nyquist band in which the RF ADC 104 is operating. The scaling circuit 510, as represented in FIG. 5, includes a multiplexer 518 and a multiplier 520. The multiplexer 518 selects a scaling factor ($\delta_x$) based on the Nyquist index value, and the multiplier 520 multiples the output of the fixed coefficient filter 504 by the selected scaling factor. In some implementations, multiplication by the scaling factors may be implemented as constant multiplications, where the Nyquist index selects the constant multiplication circuitry to be applied to the output of the fixed coefficient filter 504.

Table 2 below shows an example of scaling factors applied by the scaling circuit 508 and the scaling circuit 510.

Some implementations of the multi-Nyquist differentiator 500 may employ different scaling factors and/or a different number of scaling factors.

TABLE 1

| Nyquist Band | $\gamma_k$ | $\delta_k$ |
|---|---|---|
| 1 | 1 | 1 |
| 2 | −1/2 | 3/2 |
| 3 | 1/3 | 1/3 |
| 4 | −1/4 | 7/4 |
| 5 | 1/5 | 1/5 |
| 6 | −1/6 | 11/6 |

The summation circuit 512 is coupled to the scaling circuit 508 and the scaling circuit 510, and sums the output of the scaling circuit 508 and the scaling circuit 510 to produce the derivative of the digital samples generated by the RF ADC 104 for the selected Nyquist band.

Figure 6:
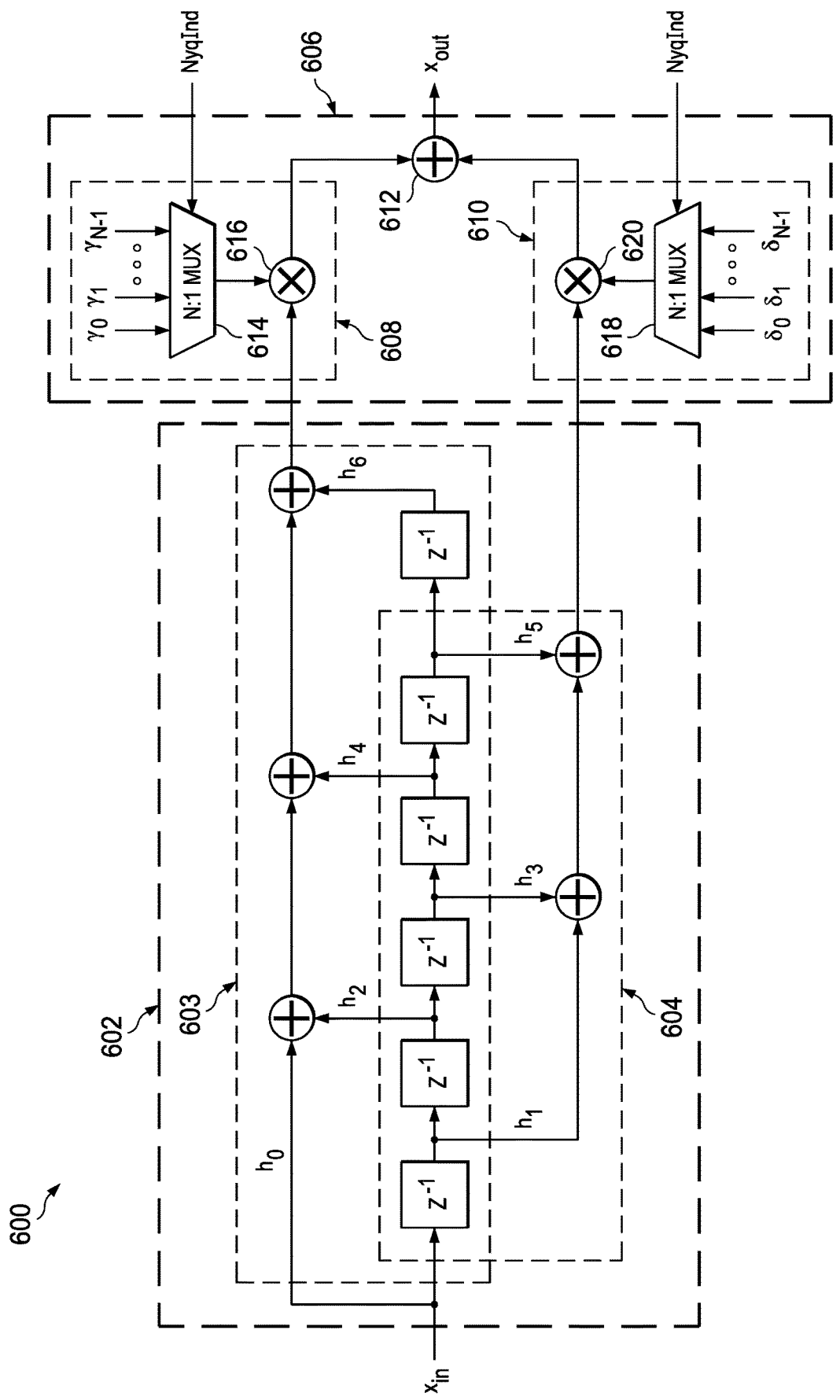
FIG. 6 shows a block diagram for an example multi-Nyquist differentiator that includes a single fixed coefficient filter in accordance with the present disclosure.

FIG. 6 shows a block diagram for an example multi-Nyquist differentiator 600 that includes a single fixed coefficient filter in accordance with the present disclosure. The multi-Nyquist differentiator 600 is an implementation of the multi-Nyquist differentiator 500. The multi-Nyquist differentiator 600 includes a single fixed coefficient filter 602 and output circuitry 606. The fixed coefficient filter 602 receives and filters the digital samples ($x_{in}$) generated by the RF ADC 104. The fixed coefficient filter 602 includes a sub-filter 603 and a sub-filter 604. The sub-filter 603 applies only outputs of even taps of the fixed coefficient filter 602, and the sub-filter 604 applies only outputs of odd taps of the fixed coefficient filter 602. The output circuitry 506 receives the output of the sub-filter 603 and sub-filter 604, scales each output, and combines the scaled outputs to produce a derivative ($x_{out}$) of the digital samples ($x_{in}$) generated by the RF ADC 104.

In the fixed coefficient filter 602 the coefficients applied to the digital samples generated by the RF ADC 104 are predetermined and unchanging. As a result, the computation circuitry of the fixed coefficient filter 602 can be simplified to provide multiplication by the constant coefficients. For example, multiplications in the fixed coefficient filter 602 may be implemented using canonical signed digit multipliers. Various implementations of the sub-filter 603 and the sub-filter 604 may be implemented as direct form finite impulse response (FIR) filters, transpose form FIR filters, cascade form FIR filters, infinite impulse response (IIR) filters, etc.

The output circuitry 606 includes a scaling circuit 608, a scaling circuit 610, and a summation circuit 612. The scaling circuit 608 scales the output of the sub-filter 603 by a value that is selected based on the Nyquist band in which the RF ADC 104 is operating. The scaling circuit 608, as represented in FIG. 6, includes a multiplexer 614 and a multiplier 616. The multiplexer 614 selects a scaling factor ($\gamma_x$) based on the Nyquist index value, and the multiplier 616 multiples the output of the sub-filter 603 by the selected scaling factor. In some implementations, multiplication by the scaling factors may be implemented as constant multiplications, where the Nyquist index selects the constant multiplication circuitry to be applied to the output of the fixed coefficient filter 602.

The scaling circuit 610 is similar to the scaling circuit 608, and may apply scaling factors that are different from those applied by the scaling circuit 608. The scaling circuit 610 scales the output of the sub-filter 604 by a value that is selected based on the Nyquist band in which the RF ADC 104 is operating. The scaling circuit 610, as represented in FIG. 6, includes a multiplexer 618 and a multiplier 620. The multiplexer 618 selects a scaling factor (Ox) based on the Nyquist index value, and the multiplier 620 multiples the output of the sub-filter 604 by the selected scaling factor. In some implementations, multiplication by the scaling factors may be implemented as constant multiplications, where the Nyquist index selects the constant multiplication circuitry to be applied to the output of the sub-filter 604.

The summation circuit 612 is coupled to the scaling circuit 608 and the scaling circuit 610, and sums the output of the scaling circuit 608 and the scaling circuit 610 to produce the derivative of the digital samples generated by the RF ADC 104 for the selected Nyquist band.

Figure 7:
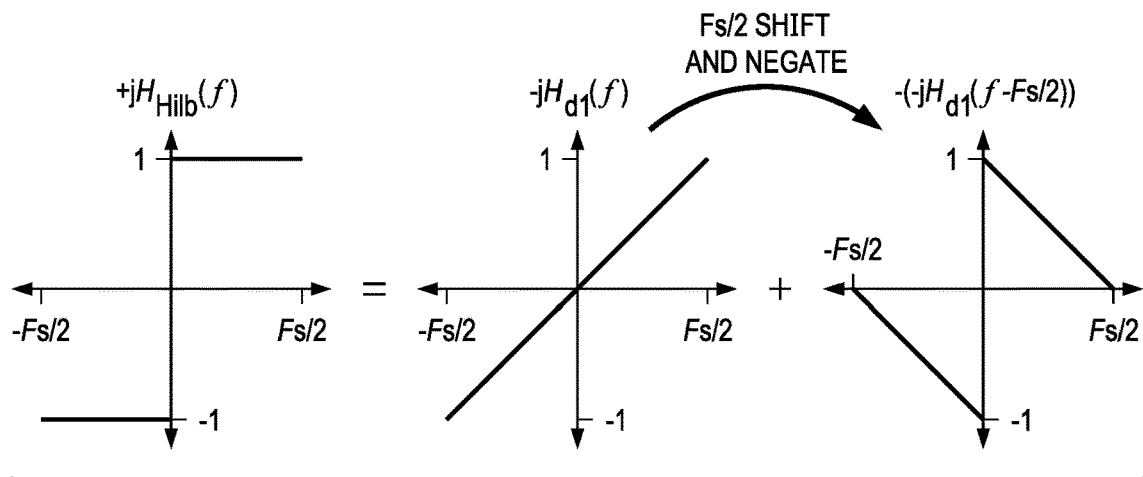
FIG. 7 shows a Hilbert transform as a combination of a first Nyquist derivative and a scaled and frequency-shifted first Nyquist derivative.

FIG. 7 shows a Hilbert transform as a combination of a first Nyquist derivative and a scaled and frequency-shifted first Nyquist derivative. FIG. 7 shows the frequency response of the Hilbert transform can be produced by the odd taps of the derivative of the first Nyquist.

$$-h_{Hilb}(n) = h_{d_1}(n) - (-1)^n h_{d_1}(n) = \begin{cases} 2h_{d_1}(n), & n \text{ odd} \\ 0, & n \text{ even} \end{cases} \quad (3)$$

Thus, in the multi-Nyquist differentiator 500 and the multi-Nyquist differentiator 600, equation (2) is regrouped, in terms of the even and odd sub-filters, as:

$$H_{d_k} = \gamma_k H_e(z) + \delta_k H_o(z) \quad (4)$$

Figure 8:
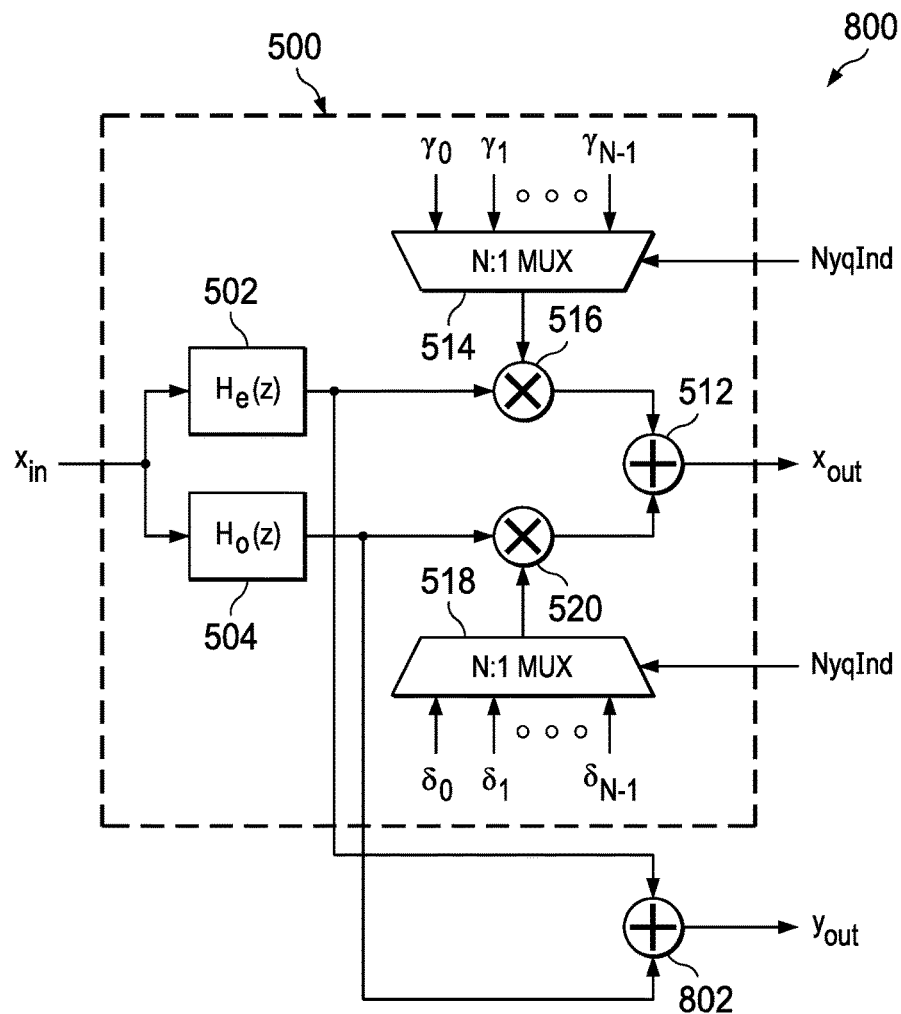
FIG. 8 shows a block diagram for an example multi-Nyquist filter that includes circuitry to generate a first Nyquist derivative in accordance with the present disclosure.

FIG. 8 shows a block diagram for an example multi-Nyquist filter 800 that includes circuitry to generate a first Nyquist derivative in addition to a selectable Nyquist derivative in accordance with the present disclosure. The multi-Nyquist filter 800 includes the multi-Nyquist differentiator 500 and summation circuitry 802. The summation circuitry 802 is coupled to the fixed coefficient filter 502 and the fixed coefficient filter 504. The 802 sums the outputs of the fixed coefficient filter 502 and the fixed coefficient filter 504 to produce the derivative ($y_{out}$) of digital signals generated by the RF ADC 104 for the first Nyquist band in addition to the derivative ($x_{out}$) for a selected Nyquist band generated by the multi-Nyquist differentiator 500.

Some implementations of the multi-Nyquist filter 800 include the multi-Nyquist differentiator 600 rather than the multi-Nyquist differentiator 500, and the summation circuitry 802 is coupled to the outputs of the sub-filter 603 and the sub-filter 604.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A radio frequency (RF) sampling receiver, comprising:
    an analog-to-digital converter (ADC) configured to digitize received RF signals; and
    a non-linearity correction circuit coupled to an output of the ADC, the non-linearity correction circuit comprising:
        a multi-Nyquist differentiator, comprising:
            a fixed coefficient filter configured to filter digital samples generated by the ADC;

a scaling circuit coupled an output of the fixed coefficient filter, and configured to scale output of the fixed coefficient filter based on a selected Nyquist band; and a summation circuit coupled to the scaling circuit, and configured to generate a derivative of the digital samples for the selected Nyquist band based on output of the scaling circuit.

2. The RF sampling receiver of claim 1, wherein:
the fixed coefficient filter is a first fixed coefficient filter;
the scaling circuit is a first scaling circuit; and
the multi-Nyquist differentiator comprises:
a second fixed coefficient filter configured to filter the digital samples generated by the ADC;
a second scaling circuit coupled to an output of the second fixed coefficient filter, and configured to scale output of the second fixed coefficient filter based on a selected Nyquist band.

3. The RF sampling receiver of claim 2, wherein the summation circuit is coupled to the second scaling circuit, and is configured to generate the derivative of the digital samples as a sum of output of the first scaling circuit and output of the second scaling circuit.

4. The RF sampling receiver of claim 2, wherein each of the even-indexed taps of the first fixed coefficient filter is zero;
each of the odd-indexed taps of the second fixed coefficient filter is zero.

5. The RF sampling receiver of claim 4, wherein:
the summation circuit is a first summation circuit; and
the multi-Nyquist differentiator comprises a second summation circuit coupled to the first fixed coefficient filter and the second fixed coefficient filter, and configured to generate an additional derivative of the digital samples as a sum of the output of the first fixed coefficient filter and the output of the second fixed coefficient filter.

6. The RF sampling receiver of claim 2, wherein:
the first scaling circuit is configured to select a first scaling factor to apply to the output of the first fixed coefficient filter based on the selected Nyquist band; and
the second scaling circuit is configured to select a second scaling factor to apply to the output of the second fixed coefficient filter based the selected Nyquist band.

7. The RF sampling receiver of claim 1, wherein the fixed coefficient filter comprises:
an odd sub-filter configured to produce an output based on odd-indexed taps of the fixed coefficient filter; and
an even sub-filter configured to produce an output based on even-indexed taps of the fixed coefficient filter;
wherein the scaling circuit is coupled to and configured to scale output of the odd sub-filter.

8. The RF sampling receiver of claim 7, wherein:
the scaling circuit is a first scaling circuit; and
the multi-Nyquist differentiator comprises a second scaling circuit coupled to and configured to scale output of the even sub-filter;
the first scaling circuit is configured to select a first scaling factor to apply to the output of the odd sub-filter based on the selected Nyquist band; and
the second scaling circuit is configured to select a second scaling factor to apply to the output of the even sub-filter based the selected Nyquist band.

9. The RF sampling receiver of claim 8, wherein the summation circuit is coupled to the second scaling circuit, and is configured to generate the derivative of the digital samples as a sum of output of the first scaling circuit and output of the second scaling circuit.

10. The RF sampling receiver of claim 8, wherein:
the summation circuit is a first summation circuit, and
the multi-Nyquist differentiator comprises a second summation circuit coupled to the odd sub-filter and the even sub-filter, and configured to generate an additional derivative of the digital samples as a sum of output of the odd sub-filter and output of the even sub-filter.

11. A multi-Nyquist differentiator circuit, comprising:
a first fixed coefficient filter configured to filter digital samples generated by an ADC;
a second fixed coefficient filter configured to filter the digital samples generated by the ADC;
output circuitry coupled to the first fixed coefficient filter and the second fixed coefficient filter, and configured to combine output of the first fixed coefficient filter and the second fixed coefficient filter to generate a derivative of the digital samples.

12. The multi-Nyquist differentiator circuit of claim 11, wherein the output circuitry comprises a scaling circuit coupled to the first fixed coefficient filter, and configured to scale output of the first fixed coefficient filter based on a selected Nyquist band.

13. The multi-Nyquist differentiator circuit of claim 12, wherein:
the scaling circuit is a first scaling circuit;
the multi-Nyquist differentiator comprises a second scaling circuit coupled to the second fixed coefficient filter, and configured to scale the output of the second fixed coefficient filter based on the selected Nyquist band;
the first scaling circuit is configured to select a first scaling factor to apply to the output of the first fixed coefficient filter based on selected Nyquist band; and
the second scaling circuit is configured to select a second scaling factor to apply to the output of the second fixed coefficient filter based on the selected Nyquist band.

14. The multi-Nyquist differentiator circuit of claim 13, further comprising a summation circuit coupled to the first scaling circuit and the second scaling circuit, and configured to generate the derivative of the digital samples as a sum of output of the first scaling circuit and output of the second scaling circuit.

15. The multi-Nyquist differentiator circuit of claim 11, wherein:
each of the even-indexed taps of first fixed coefficient filter is zero; and
each of the odd-indexed taps of the second fixed coefficient filter is zero.

16. The multi-Nyquist differentiator circuit of claim 15, wherein the output circuitry comprises a summation circuit coupled to the first fixed coefficient filter and the second fixed coefficient filter, and configured to generate an additional derivative of the digital samples as a sum of output of the first fixed coefficient filter and output of the second fixed coefficient filter.

17. A multi-Nyquist differentiator circuit, comprising:
a fixed coefficient filter configured to filter digital samples generated by the ADC, and comprising:
an odd sub-filter configured to produce an output based on odd-indexed taps of the fixed coefficient filter; and
an even sub-filter configured to produce an output based on even-indexed taps of the fixed coefficient filter; and
output circuitry coupled to the fixed coefficient filter, and configured to combine output of the odd sub-filter and the even sub-filter to generate a derivative of the digital samples.

18. The multi-Nyquist differentiator circuit of claim 17, wherein the output circuitry comprises a scaling circuit coupled to the odd sub-filter, and configured to scale output of the odd sub-filter based on a selected Nyquist band.

19. The multi-Nyquist differentiator circuit of claim 18, wherein:

the scaling circuit is a first scaling circuit; and the multi-Nyquist differentiator comprises a second scaling circuit coupled to the even sub-filter, and configured to scale output of the even sub-filter based on the selected Nyquist band.

20. The multi-Nyquist differentiator circuit of claim 19, wherein:

the first scaling circuit is configured to select a first scaling factor to apply to the output of the odd sub-filter based on the selected Nyquist band; and the second scaling circuit is configured to select a second scaling factor to apply to the output of the even sub-filter based the selected Nyquist band.

21. The multi-Nyquist differentiator circuit of claim 19, further comprising a summation circuit coupled to the first scaling circuit and the second scaling circuit, and configured to generate the derivative of the digital samples as a sum of the output of the first scaling circuit and the output of the second scaling circuit.

22. The multi-Nyquist differentiator circuit of claim 21, wherein:

the summation circuit is a first summation circuit; and the multi-Nyquist differentiator circuit further comprises a second summation circuit coupled to the odd sub-filter and the even sub-filter, and configured to generate an additional derivative of the digital samples as a sum of output of the odd sub-filter and the even sub-filter.

* * * * *